United States Patent [19]

Donecker et al.

[11] Patent Number: 4,720,677

[45] Date of Patent: Jan. 19, 1988

[54] R. F. TRIAXIAL DIRECTIONAL BRIDGE

[75] Inventors: S. Bruce Donecker, Sebastopol; Julius K. Botka, Santa Rosa, both of Calif.

[73] Assignee: Hewlett-Packard Company, Palo Alto, Calif.

[21] Appl. No.: 737,300

[22] Filed: May 16, 1985

Related U.S. Application Data

[62] Division of Ser. No. 568,986, Jan. 9, 1984, Pat. No. 4,588,970.

[51] Int. Cl.[4] .................. G01R 31/02; G01R 27/04
[52] U.S. Cl. ......................... 324/158 F; 324/58 R
[58] Field of Search ............. 324/158 F, 58 R, 57 R; 333/24 R, 22 R

[56] References Cited

U.S. PATENT DOCUMENTS

| | | | |
|---|---|---|---|
| 2,579,751 | 12/1951 | Muchmore | 178/44 |
| 2,779,002 | 1/1957 | Foster et al. | 333/22 |
| 2,976,497 | 3/1961 | Watts, Jr. | 333/9 |
| 3,278,840 | 10/1966 | Wilson | 324/57 |
| 3,309,634 | 3/1967 | Wheeler et al. | 333/81 |
| 3,479,587 | 11/1969 | MacKenzie et al. | 324/58 |
| 3,483,419 | 12/1969 | Luebke | 315/5.34 |
| 3,530,407 | 9/1970 | Blight | 333/11 |
| 3,560,889 | 2/1971 | Suetake et al. | 333/22 |

FOREIGN PATENT DOCUMENTS

| | | |
|---|---|---|
| 1094362 | 3/1958 | Fed. Rep. of Germany . |
| 1144354 | 12/1959 | Fed. Rep. of Germany . |
| 1154535 | 5/1961 | Fed. Rep. of Germany . |
| 2927865 | 1/1980 | Fed. Rep. of Germany . |
| 8119649 | 10/1981 | France . |
| 5815310 | 7/1981 | Japan . |

OTHER PUBLICATIONS

Yasutaka Shimizu, et al; Absorbing Wall Utilizing the Combination of Lossy Dielectric Layers and a Magnetic Layer; submitted 11/29/69; pp. 65–71.

Youji Kotsuka and Kunihiro Suetake; Design of Small-Sized Coaxial Attenuator Using a Ferrite Cylinder; submitted Mar. 30, 1974; pp. 52–59.

*Primary Examiner*—Ernest F. Karlsen
*Attorney, Agent, or Firm*—Jeffery B. Fromm; Joseph H. Smith

[57] ABSTRACT

A wide bandwidth R. F. vector bridge is provided which is made up of a housing and a microcircuit contained therein. The microcircuit includes a substrate having two opposing faces, and a patterned layer of conductive material on each face defining a reflection port area, a reference port area, and a test port area. A first impedance means provides a first impedance between the reflection port area and the reference port area, and a second impedance means provides a second impedance between the reflection port area and the test port area. Also included are a reflection port means for coupling the reflection port area to other electrical components, a reference port means for coupling the reference port area to a reference load, and a test port means for coupling the test port area to a device under test. The first and second impedance means, the reflection port means, the reference port means, and the test port means are arranged to provide equal times for signal transit between the reflection port means and the test port means and between the reflection port means and the reference port means.

20 Claims, 23 Drawing Figures $R_0$ — REFERENCE LOAD
$R_1 = R_2$
NORMALLY $R_1 = R_2 = R_3 = R_0$

INDUCTANCE AND RESISTANCE OF BEADS 757 VERSUS FREQUENCY

FIG 7F₁

DAMPING CURVES FOR BEADS 757 WITH ADDITIONAL PARALLEL CAPACITOR

R. F. TRIAXIAL DIRECTIONAL BRIDGE

CROSS REFERENCE TO RELATED APPLICATION

This is a division of application Ser. No. 568,986 filed Jan. 9, 1984, now U.S. Pat. No. 4,588,970.

BACKGROUND OF THE INVENTION

This invention relates to R.F. network analyzers, and particularly to very broadband R.F. directional bridges for performing vector measurements and time domain reflectometry.

Figures 1, 2, 3:
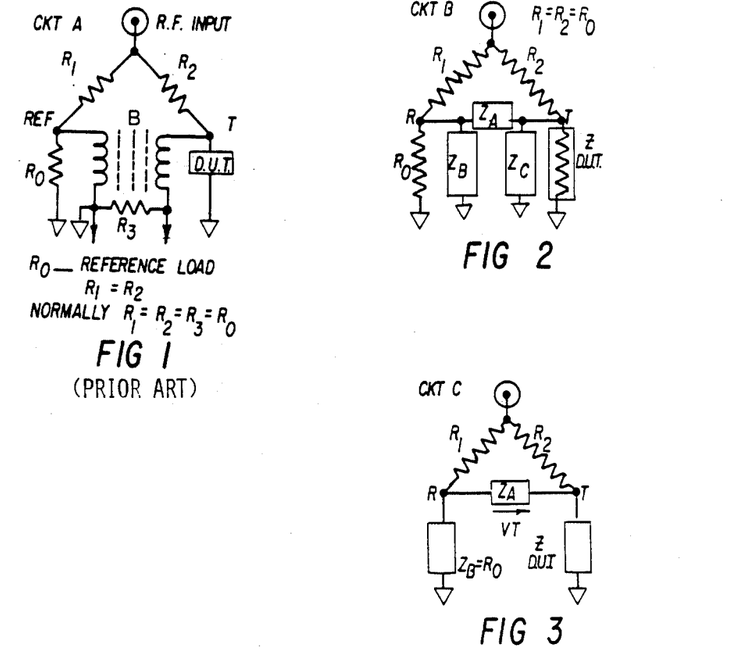
FIG. 1 shows a typical prior art bridge.
FIG. 2 shows an equivalent circuit for an actual bridge in accordance with FIG. 1.
FIG. 3 shows a terminated Wheatstone bridge in accordance with the invention.

Characterizing circuits in the frequency domain is a fundamental activity in both the design and testing of electronic circuits. Only by knowing the gain/phase-vs-frequency characteristics and the input-output impedances of each circuit can one assemble a complete device capable of meeting performance objectives. In recent years, significant progress has been made in the development of network analyzers to characterize component and circuit performance. By providing plots of gain or loss, phase shift and reflection coefficients versus frequency, these instruments have given electronic engineers in depth practical insight into circuit and component behavior. In addition, with better computational devices and wider bandwidth measuring instruments, time domain reflectometry is more readily available which further enhances insight into circuit behavior and leads to more precise designs. In turn, these designs have led to tighter system performance requirements, for example, closer packing of communications channels and this in turn has led to a demand for even better measuring instruments. At the heart of such measuring instruments is the directional bridge for separating reflected and transmitted signals from incident signals, e.g., in order to characterize the S-parameters of a device under test (D.U.T.). Such a prior art bridge is shown in FIG. 1. Here the device is typically symmetric relative to the R.F. input, with the resistance of resistors R1 and R2 being equal to each other, and equal in value to that of load resistor R0, i.e., R1=R2=R0. The device is typically implemented with a balun B between reference port (REF) and test port (T), and with a termination resistor R3=R0 for extracting the signal. As a practical matter, however, the circuit of FIG. 1 is highly idealized. If the balun and termination are replaced by equivalent realistic impedances, the difficulties in constructing such a device become readily apparent. A corresponding equivalent circuit is shown in FIG. 2. Here, R1=R2=R0 as before. However, for satisfactory measurements the following requirements must be satisfied: (1) the parasitic shunt impedances ZB and ZC must be very large, i.e., ZB>>R0 and ZC>>Z D.U.T. where Z D.U.T. is the impedance of the device under test; or (2) ZB and ZC must be extremely well balanced, i.e., ZB=ZC exactly; or (3) ZB and ZC must satisfy some relation which is a compromise between (1) and (2) above. For measuring instruments which are restricted to a few octaves or less in bandwidth, these restrictions can usually be met without extreme measures. However, above 1 to 2 GHz, it becomes very difficult to produce a broadband impedance greater than about 1 K ohm, since the impedance decreases rapidly with increasing frequency. Hence, higher frequencies impose very stringent requirements for balancing of the two shunt impedances. As a result, for very wide bandwidth devices, e.g., over the entire range from 45 MHz to 26.5 GHz, it does not appear physically possible with the present state of the art to provide such high impedances or such precise balancing. Nevertheless, wide bandwidth directional bridges are highly desirable for automated test equipment using broadband sweepers to characterize circuit parameters and are particularly important for performing Fourier transforms for accurate time domain reflectometry, a technique which has proven extremely useful in solving intricate design problems. To date, the practical difficulties of extracting the desired differential signal over such a wide bandwidth without introducing unbalanced parasitic impedances has eluded the industry.

SUMMARY OF THE INVENTION

In accordance with the preferred embodiments of the invention provided is a design for a terminated R.F./microwave Wheatstone bridge and a precision termination which can be used therewith.

The precision termination has an essentially constant impedance over a very wide range of frequencies, the return loss being 40 dB or less from 1 GHz to 26.5 GHz and less than 34 dB from 45 MHz to 16 Hz. The termination has three distinct portions. A first portion having a continuous load element having inner taper of a relatively loss free dielectric and an outer taper of a lossy material, the combination providing a constant impedance in the higher frequencies. (This first continuous taper portion which is dielectrically loaded is useful by itself for a high frequency termination.) This first portion, however, includes two additional tapered sections which are stepwise tapered to broaden the bandwidth of this first portion. A second portion of the precision termination is made up of a lumped load attached to the tapered portion. A third portion includes a ferrite bead distributed load attached to the lumped load opposite the tapered load.

The Wheatstone bridge is made up of a microcircuit which has a test port return loss of less than or equal to 20 dB over the entire range for frequencies from 45 MHz to 26.5 GHz. With a nominal impedance between the various ports (i.e., test port, reflection port, and reference port) of 50 ohms, this low return loss is accomplished by keeping the electrical path length in the various arms between ports at or below 0.1 the wavelength at the highest frequency.

BRIEF DESCRIPTION OF THE DRAWINGS

FIGS. 7F1 and 7F2 are graphs illustrating electromagnetic properties of a material used to manufacture a portion of the precision termination of the invention.

FIGS. 7G₁ and 7G₂ show expanded views of a lumped resistor according to the invention.

DETAILED DESCRIPTION OF THE INVENTION

In accordance with preferred embodiments of the invention, shown in FIG. 3 is a design for an R.F. terminated Wheatstone bridge which does not require either high shunt impedance or delicate balancing. Here all the elements and relationships are the same as those in FIG. 2, except that the shunt impedance ZC is substantially eliminated and ZB is made to be R0, where R0 is a constant impedance (typically 50 ohms) over the frequencies of interest, thus eliminating the separate resistor for that function and achieving a balanced bridge. With this structure, it can be shown by simple circuit analysis that the floating voltage VT, generated across the terminating impedance ZA, is proportional to the reflection coefficient of the D.U.T.

Figure 4:
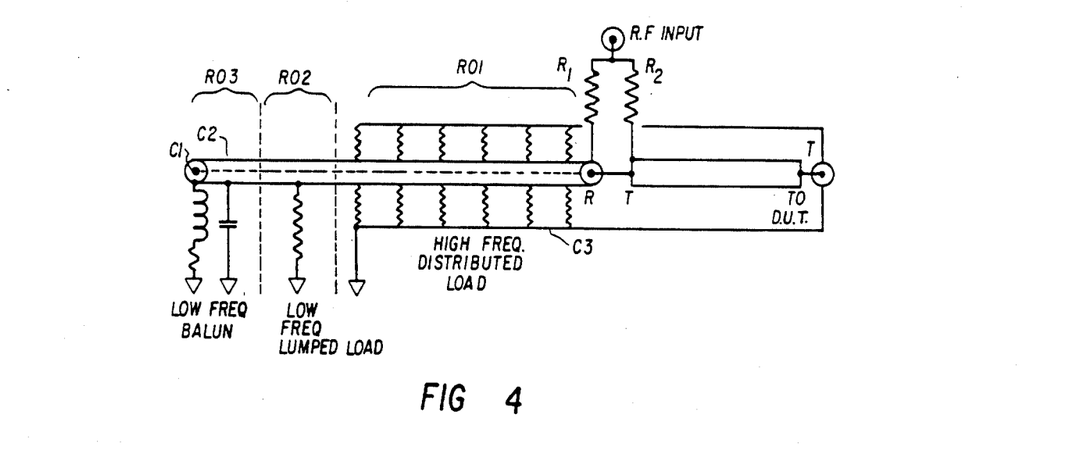
FIG. 4 shows a reference load according to the invention.

While the built-in detector of a scalar bridge can easily convert the floating R.F. voltage VT to a single-ended D.C. output, the vector bridge of FIG. 3 is faced with a much more severe challenge. It must extract the floating R.F. signal and feed it to a single ended vector detection system, without upsetting the delicate symmetry and impedance level of the bridge. For this reason, it should be readily apparent that R0 must be a precision element with a flat response over the entire frequency range of interest, which in the preferred embodiment is generally from 45 MHz to 26.5 GHz. In order to provide such a constant impedance over this large bandwidth, R0 is typically a composite system as depicted in FIG. 4. As illustrated, R0 has three distinct elements. The first, R01, is a high frequency distributed load for preventing signals at the reference port from seeing any shunt impedance other than R0. Unlike an isolated lumped resistor which provides virtually no isolation, such a distributed load can be made to provide almost any degree of isolation commensurate with acceptable dimensions. Such isolation requires, however, that there be sufficient loss per unit length to avoid introducing shunt impedance at the frequencies of interest. Losses of 20–25 dB along the length of the load (40–50 dB isolation) are generally sufficient to avoid bridge imbalance.

The second stage of the reference impedance, R02, is a lumped load placed at the end of R01 to provide a termination at lower frequencies where losses in the distributed load, R01, are insufficient to achieve isolation. To avoid parasitic shunt impedances at these lower frequencies, the third stage, R03, a ferrite core (balun), is added to keep the shunt reactance high. The magnitude of the impedances of R02 and R03 are chosen so that their combined parallel impedance is equal to R0 since R01 is transparent at low frequencies.

Another important feature of this structure is its triaxial nature, i.e., having a center conductor C1 inside a coaxial conducting sheath C2, which is itself inside a second coaxial conductor C3. Because the input and detector ports of a vector bridge are functionally interchangeable, either port may be driven while the other extracts the reflected signal. Hence, by reversing the orientation from that shown in FIG. 4 and driving from the balun end R03, the test port T can be D.C. biased by means of center conductor C1 (e.g., to provide power to transistors and I.C.'s in the D.U.T.). Such a reflectometer design is illustrated schematically in FIG. 5A. Here the balun and R' together represent the reference impedance R0. The system is fed through an R.F. power splitter 11 to provide a reference signal and to supply power to the bridge. b1 corresponds to the signal at port I together and b2 corresponds to the signal after transmission through the D.U.T.

Figure 5A:
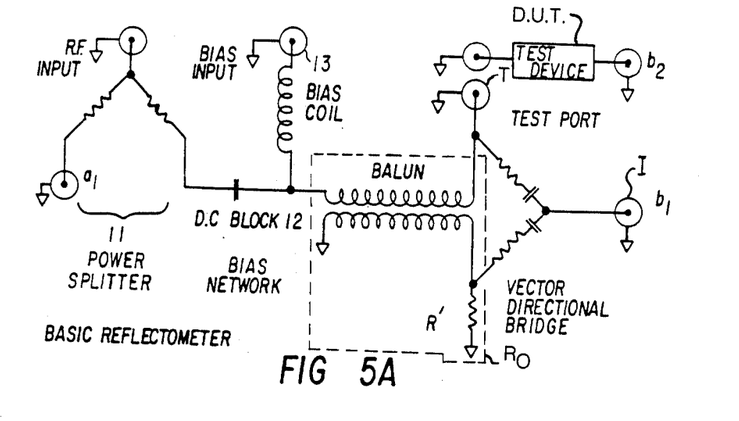
FIG. 5A shows a reflectometer configuration using a bridge according to the invention.
Figure 5B:
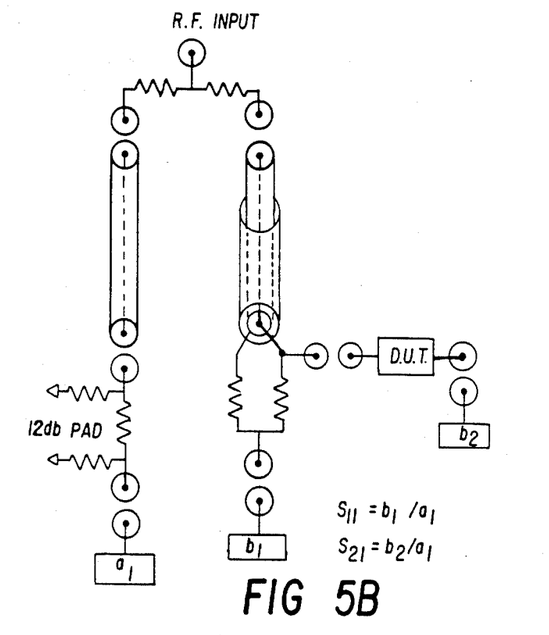
FIG. 5B shows a reflection/transmission setup for use in an automated network analyzer

The vector ratio b1/a1 is proportional to the input reflection coefficient while b2/a1 is proportional to the transmission coefficient of the D.U.T.. Also, included is a D.C. block 12 for isolating the R.F. power input from the bias voltage provided by bias input 13 on the center conductor of the reference impedance R0. Shown in FIG. 5B is a typical reflection/transmission test setup which is particularly adapted for use by an automated R.F. network analyzer.

Figure 6:
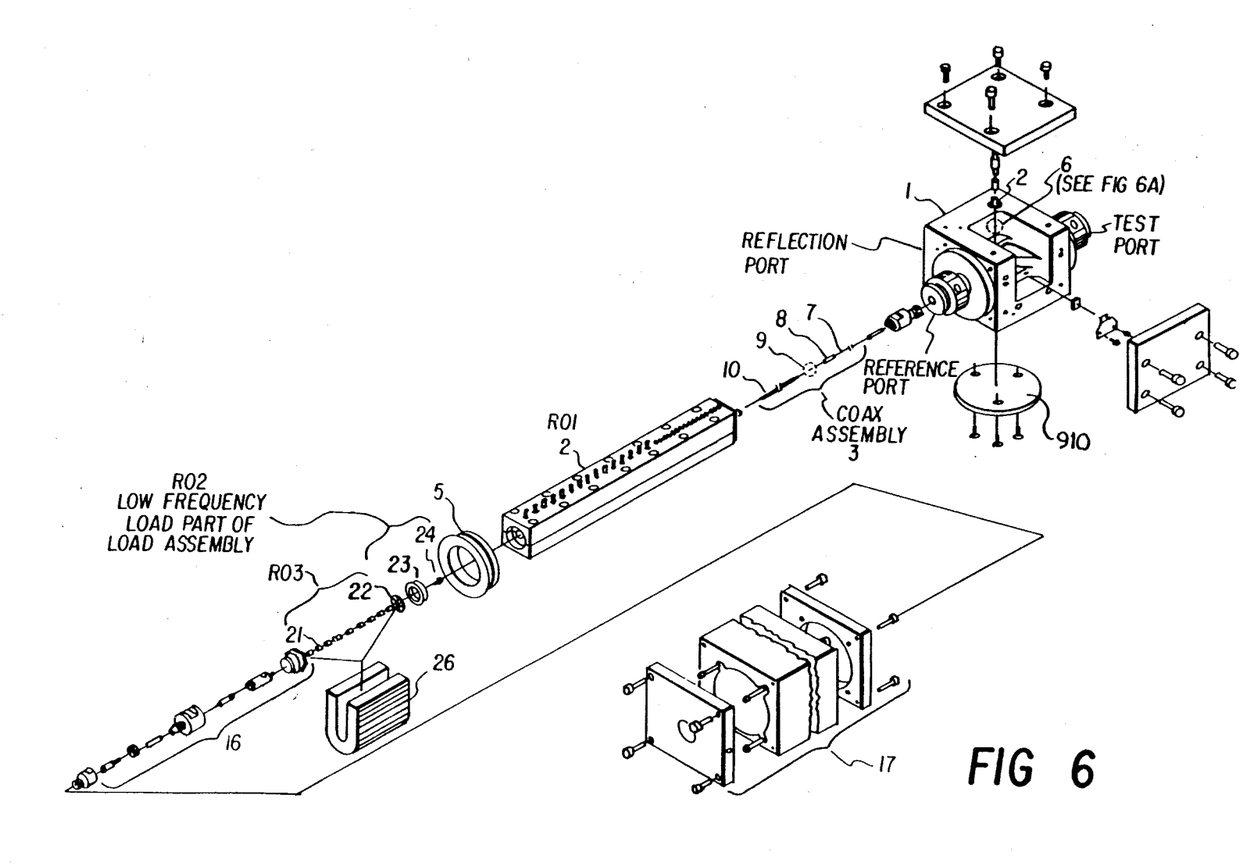
FIGS. 6, 6A and 6B show an exploded view of the bridge system and reference port.
Figure 6A:
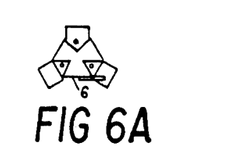
Figure 6B:
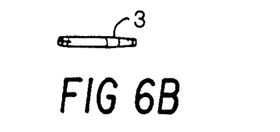
Figure 7A:
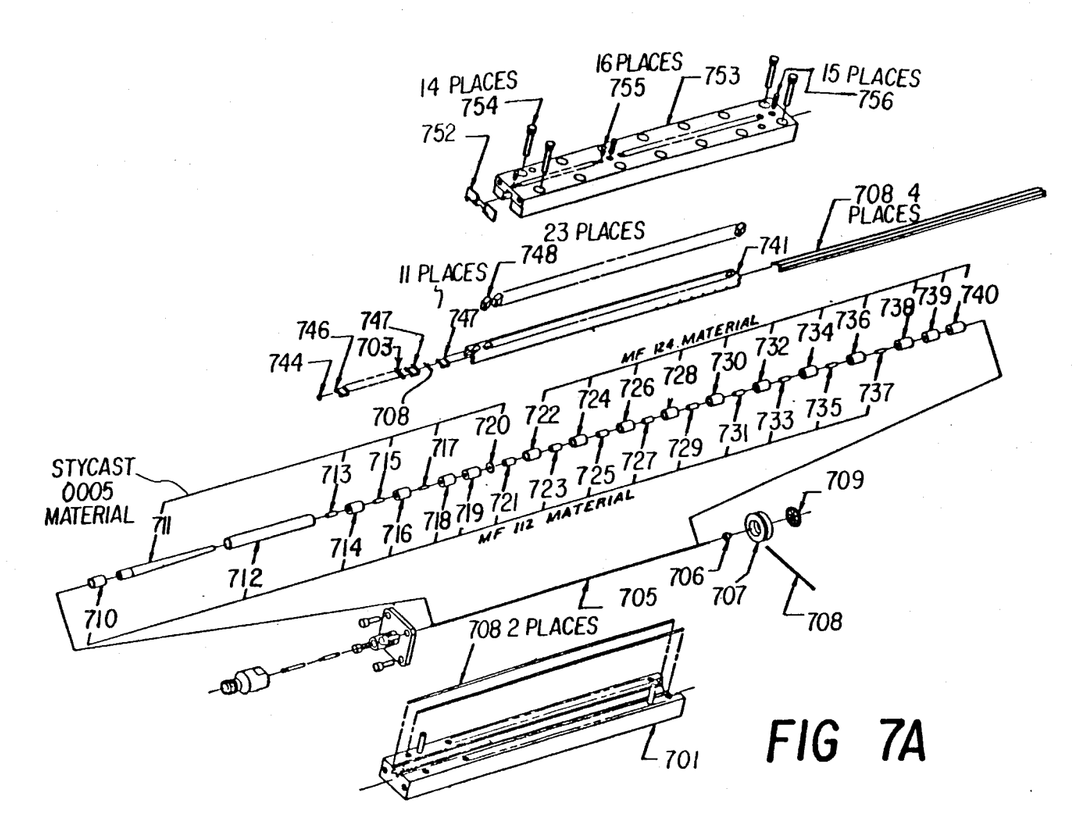
FIGS. 7A, 7B, 7C, 7D, and 7E show expanded views of the reference load and its elements.

In accordance with the preferred embodiments of the invention, a practical implementation of the bridge and the accompanying precision broadband load assembly is depicted in a somewhat exploded view in FIG. 6. The system is made up of a bridge assembly housing 1, which contains a bridge microcircuit 6 (shown in enlarged view in FIG. 6A) for providing electrical connections between the reflection port, the test port and the reference port. Also included in housing 1 is an adjustable spring loaded top ground plane 2. Also shown is a coax assembly 3 (also illustrated in an enlarged view in FIG. 6B) for connecting the high frequency portion R01 of the reference load to the reference port of the microwave bridge. This is accomplished by providing a tapered transition from center coax 10 of R01 to center coax 7 of the reference port which feeds microcircuit 6, the transition being accomplished by means of an inner taper 9 and an outer taper 8 as shown in FIG. 7A. At the other end of the distributed portion of the R01 reference load is the lumped load R02 which is made up of a 61.5 ohm resistor 22 and an inner conductor 24 and outer conductor 23. Attached to lumped load R02 is the balun section R03 made up of a series of ferrite beads, such as bead 21, located on the coax. The impedance of R03 is generally chosen to be about 285 ohms in order to provide a combined shunt impedance with R02 of 50 ohms.

Balun R03 is typically formed into a single loop for mechanical stress relief purposes and a pad of polyurethane foam 26 is formed around it for protection from impact. Coax assembly 16 then provides connection for R.F. input and D.C. bias, and a grommet 5 is used to stabilize the positions of loads R02 and R03 in a load shroud assembly 17.

Figure 7B:
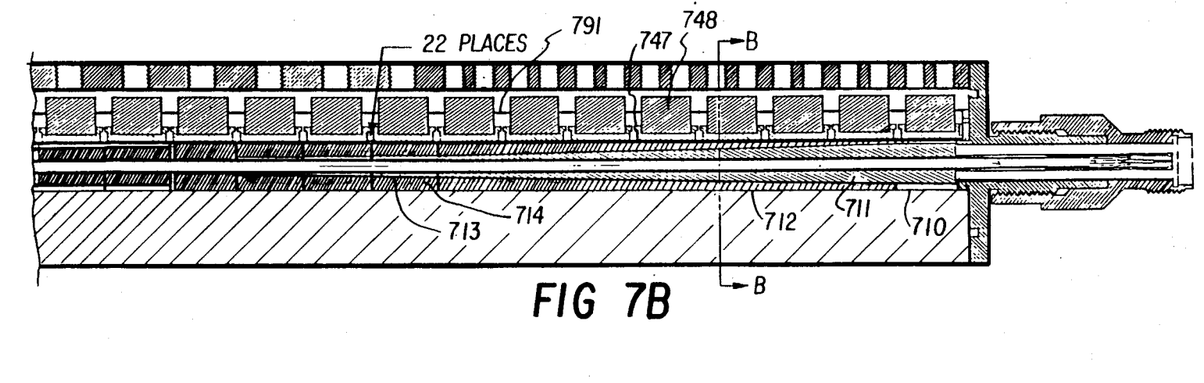

Shown in FIG. 7A is an expanded view of distributed load R01 and lumped load R02. For purposes of discussion, all elements not already described previously will be numbered in the 700's to associate that element with FIG. 7. Element 701 is a bottom ground plane, typically aluminum, having a groove therein to accommodate the distributed load material of the triaxial structure. as can be seen from FIGS. 7A and 7B tapered loads 711 and 712 typically provide a constant impedance distributed load for frequencies above about 8 GHz, while the balance of the loads 713 through 740 are for achieving a flat response in the intermediate frequency ranges. As illustrated in FIG. 7B, tapered loads 711 and 712 are physically mated to achieve a snug fit. Tapered load 711 is typically constructed of a relatively lowless material such as cross-linked polystyrene having a relative dielectric constant of about 2.54 (e.g., STYCAST 0005, which is manufactured by Emerson & Cuming) so that the distributed load is dielectrically loaded on the front end rather than relying on air as the dielectric. This dielectric loading is very important in achieving the desired matching characteristics with the lumped load. At the front end of tapered load 711 the preferred diameter is about 0.1497 inches, while at the distal end the preferred diameter is about 0.0797 inches. The preferred length for tapered load 711 is generally about 1.959 inches with taper beginning about 0.230 inches from the front. Tapered load 712 is typically constructed of a machineable lossy material such as MF112 which is also manufactured by Emerson & Cuming. Table I provides a list of the electromagnetic characteristics of MF112 as a function of frequency.

Figure 7C:
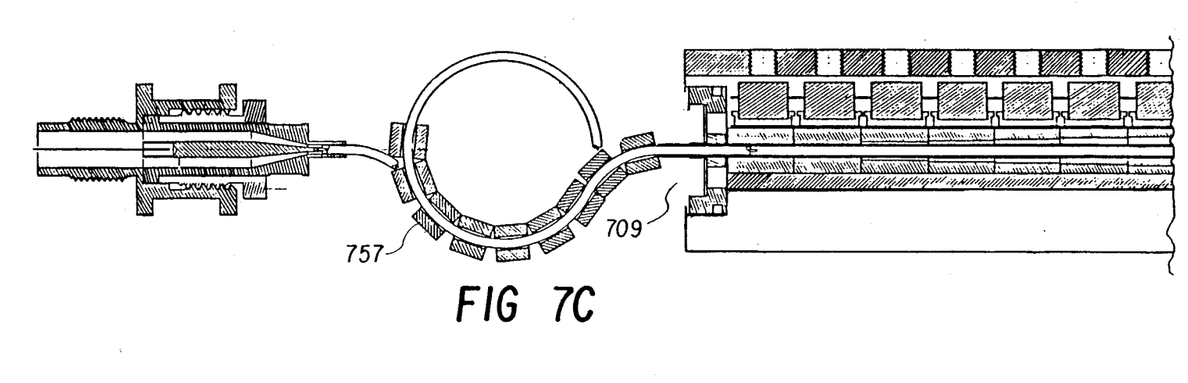

The balance of the distributed load, i.e., loads 13 through 40, carries through this tapered load concept, except that the loads are stepwise tapered. Generally step tapered terminations have a relatively narrow bandwidth and critical dimensionality. However, by using lossy loads in multiple steps (i.e., multiple loads) the bandwidth can be increased while at the same time reducing the overall length of the distributed load section. In addition, the use of lossy loads provides a forgiving structure, since subsequent losses in successive loads tend to obscure reflections at interfaces between loads. As indicated in FIG. 7A in the first stepwise taper, inner loads 713, 715, 717, and load spacer 720 are typically constructed of STYCAST 0005 material, while outer loads 714, 716, 718, and 719, and inner loads 721, 723, 725, 727, 729, 731, 733, 735, and 737 are typically constructed of MF112 material. The second stepwise taper begins at load 722 and continues through load 740, with loads 722, 724, 726, 728, 730, 732, 734, 736, 738, 739, and 740 being constructed of MF124, a material produced by Emerson & Cuming which has a substantially higher loss than MF112. Table I also lists the electromagnetic characteristics of MF124 as a function of frequency. MF112 and MF124 were chosen because they are a mixture of lossy elements in a base material which is the same as STYCAST 0005. Hence, at low frequencies where the lossy elements have a minimal loss contribution, the outer taper resembles the inner taper, so that the distributed portion and the lumped load termination together are essentially matched to the reference impedance. Table II is a list of the inside and outside diameters of each of the loads. The linear dimension of each load is 0.25 inches, except for load 719 which is 0.230 inches long and load 719 which together with load spacer 720 totals 0.25 inches. As indicated in drawings 7A, 7B, and 7C, the loads are strung in close contact on a center conductor 705. The diameter of center conductor 705 is nominally 0.0474 inches.

Figure 7D:
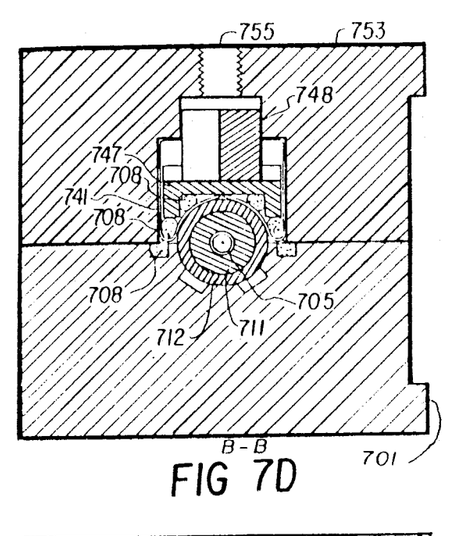
Figure 7E:
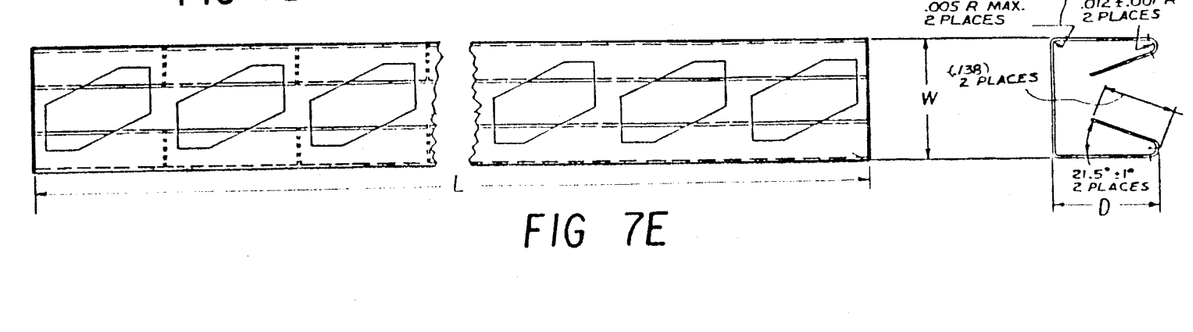

Holding loads 710 through 740 in place is an adjustable top ground plane 741, typically constructed of gold-plated berylliumcopper and nominally having a width W of 0.237 inches, a depth D of 0.197 inches, and a length L of 5.735 inches (see FIGS. 7A and 7E). Holes in the top of ground plane 741 permit press blocks 748 to extend through the top surface to contact conductive shoes 747 which in turn contact the lower flanges of the top ground plane, in order to push them into firm contact with the load elements (see FIG. 7D for a cross-section showing the deformation of the top ground plane on the outer surface of the load). The force for press blocks 748 is furnished by set screws 755 and 756 mounted in a top housing 753. This ability to tune the individual load elements via the top ground plane is particularly important in achieving a precision load since step-tapered loads can be particularly sensitive to small changes in magnetic and dielectric properties. It should also be noted that throughout the system, RFI round strip conductive elastomeric gaskets 708 are provided to insure good electrical contact.

Figure 7F:
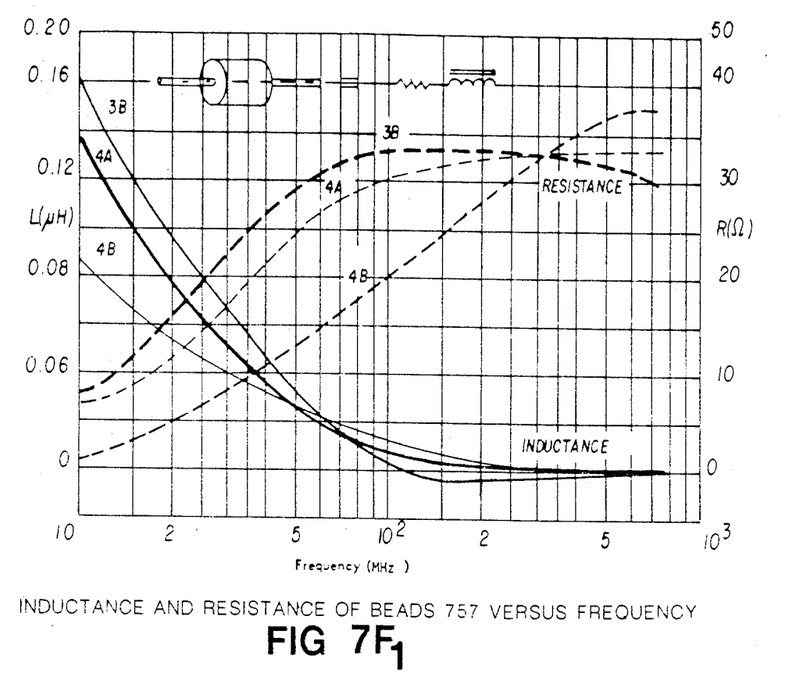
Figure 7F:
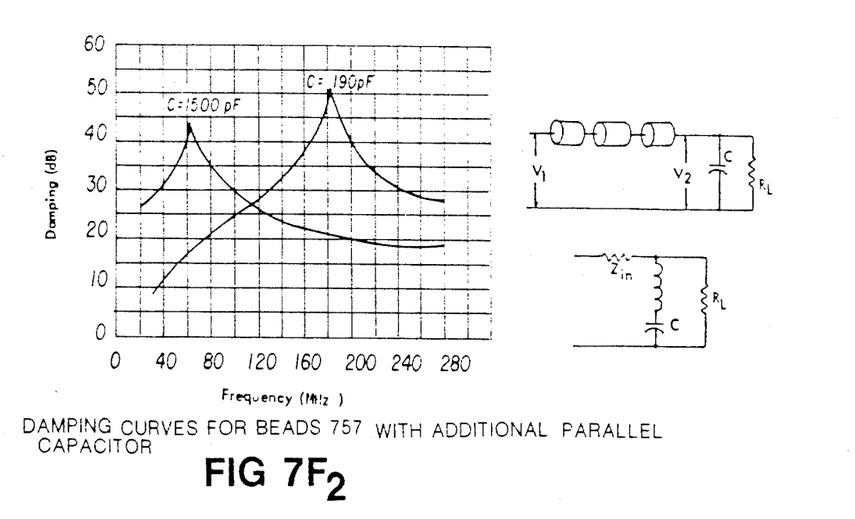
Figures 7G, 7G:
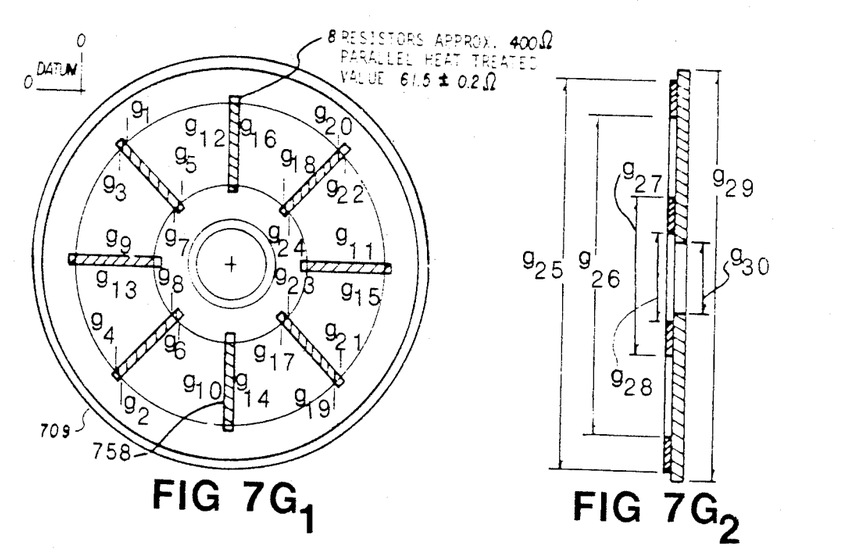
Figure 7H:
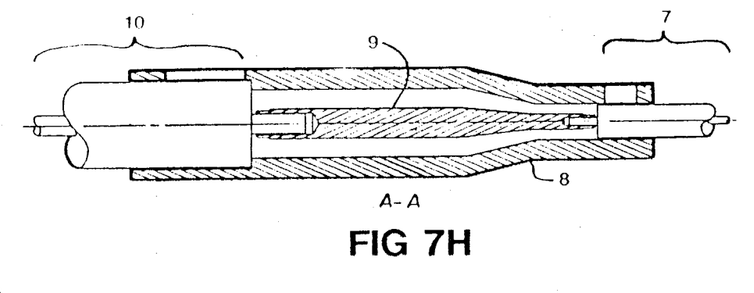
FIG. 7H shows an enlarged cross-sectional view of the taper of FIG. 6B which connects the reference port to the inner coax of the precision termination of the invention.

Shown in FIG. 7C is the tail end of the reference load illustrating the single loop of the inner coax threaded through a sequence of nine (9) ferrite shielding beads 757. Such beads are used because they have a high magnetic permeability and are very lossy, so that when the inner coax is eventually shorted to ground, there will be enough series loss to isolate the short and provide a precision reference termination. A typical material for beads 757 is Ferroxcube material 3B (available from Hewlett-Packard Company as stock number 9170-0016), having an initial magnetic permeability of 900 at 20 degrees Celsius. Beads 757 typically have an inner diameter of 0.051 inches, and outer diameter of 0.138 inches, and are 0.159 inches long, so as to achieve an impedance of 300 ohms in this balun section. FIGS. $7F_1$ and $7F_2$ are plots of the electrical characteristics of beads 757.

Shown in FIGS. $7G_1$ and $7G_2$ is an expanded view of lumped resistor 709 (the equivalent of R02 of FIG. 4). It is generally constructed by connecting inner and outer rings of gold-coated sapphire with eight identical, equally spaced, resistors 758 to obtain a combined resistance of 61.5 ohms.

The outer diameter of the outer ring of the sapphire substrate is typically 0.345 inches and the inner diameter is typically 0.270 inches. The outer diameter of the inner ring is typically 0.135 inches and the inner diameter of the inner ring is typically 0.075 inches. Resistors 758 are generally constructed of tantalum. Other typical dimensions shown in FIGS. $7G_1$ and $7G_2$ are:

| | |
|---|---|
| $g_1, g_2 =$ | .152" |
| $g_3, g_4 =$ | .032" |
| $g_5, g_6 =$ | .107" |
| $g_7, g_8 =$ | .987" |
| $g_9, g_{10}, g_{11}, g_{12} =$ | .915" |
| $g_{13}, g_{14}, g_{15}, g_{16} =$ | .085" |
| $g_{17}, g_{18} =$ | .898" |
| $g_{19}, g_{20} =$ | .848" |
| $g_{21}, g_{22} =$ | .968" |
| $g_{23}, g_{24} =$ | .013" |
| $g_{25} =$ | .335" |
| $g_{26} =$ | .270" |
| $g_{27} =$ | .135" |
| $g_{28} =$ | .075" |
| $g_{29} =$ | .345" |
| $g_{30} =$ | .066". |

Figure 8A:
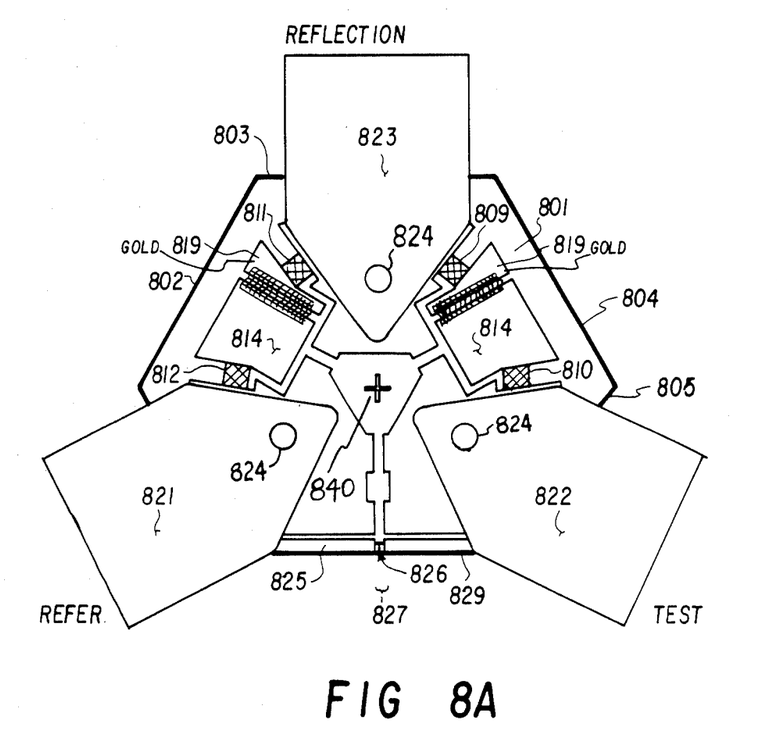
FIGS. 8A, 8B depict a microcircuit in the terminated Wheatstone bridge according to the invention.
Figure 8B:
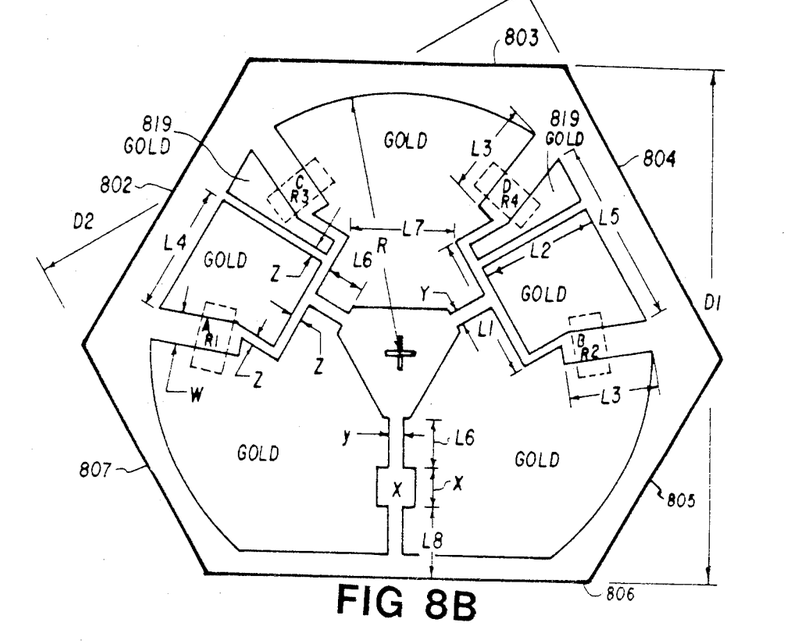

Shown in FIG. 8A is a magnified view of microcircuit 6 which was described briefly in reference to FIG. 6. The microcircuit is formed on a hexagonal sapphire substrate 801 (shown in detail in FIG. 8B) which has a nominal thickness of 10 mils. Geometrically, the circuit has reflection symmetry in a plane passing through the center of the reflection port and the center of the circuit 840. However, the hexagon is not regular. Opposite sides are parallel, sides 802, 803, and 804 are equal in length, and sides 805 and 807 are equal in length. However, side 802 is not the same length as 805 or 806. Table III gives a list of preferred dimensions for the microcircuit. Typically, the gold pattern and tantalum resistors 809, 810, 811, and 812 shown in FIGS. 8A and 8B are put down on both faces of the substrate with resistors on one face being disposed immediately opposite resistors on the other face. The resistance of each resistor 809, 810, 811, and 812 and their counterparts on the opposite face of the substrate is nominally 50.0 ohms, so that the combined resistance in each leg, i.e., between the reflection port and the reference port is 50 ohms and between the reflection port and the test port is 50 ohms. This results from the fact that each leg has a series resistance of 100 ohms on each face, and the two faces provide parallel connections to the ports. The use of two (2) parallel paths per arm helps to pull down the inductance of the system. Four (4) barium titanate single layer dielectric capacitors 814 (two (2) on each face of the substrate with each one opposite an identical one on the opposite face of the substrate) are epoxied in place in series with the resistors and gold wire mesh is used to make electrical contact between gold pads 819 and capacitors 814. Each capacitor is nominally 350 picofarads, and capacitors on opposite faces of the substrate are oriented in opposite direction for symmetry reasons.

Arrowheads 821, 822, and 823 for providing electrical and mechanical connections to each port are typically constructed of beryllium copper turned on a numerically controlled screw machine to a diameter of 0.060 inches. The overall length of the arrowheads is 0.080 inches and includes a cone portion having a length of 0.037 inches to avoid introducing unwanted capacitance into the system. Each cone portion is slotted to a width of about 11 mils to accommodate the 10 mil substrate and is soldered to the substrate via solder holes such as 824. Each arrowhead is gold plated to insure good electrical contact. Also shown in FIG. 8A is inner coax 825 which extends through the reference port arrowhead. Its center conductor 826 bridges a gap 827 of about 0.003 inches and makes contact with a dummy coax 829 typically a conducting rod which electrically connects center conductor 826 directly to the test port. Gap 827 then acts as an R.F. generator midway between the test and reference ports. The diameter of conductor 829, typically 0.013 inches, is the same as the diameter of inner coax 825 in order to maintain electrical and physical symmetry as to both the test port and reference port.

Despite the efforts at maintaining electrical and physical symmetry between ports, it is important to note that such symmetry alone is not sufficient to achieve an adequate port match. This can be most easily seen by noting that looking into the microcircuit from the generator with the test port terminated in 50 ohms, the transmission lines from the generator to the test port and reflection port should be 25 ohms for best termination (since the reflection port looks like a virtual ground because of the symmetry of the device). However, on terminating the reflection port in 50 ohms instead of the test port and looking into the microcircuit from the test port, the desired impedance should look like 100 ohms in each branch, i.e., from the test port to ground through the reflection port, and from the test port to ground through the reference port. To accommodate this poor port match, the microcircuit itself is made very small in order that the parasitic impedances introduced by the microcircuit are small relative to the 50 ohm operating impedance. By deciding on a design criterion for test port return loss, the corresponding maximum desired electrical path length between ports can be calculated using the following relationship:

$$Z_{in} = Z_o(Z_{LOAD} + Z_o \tan L) - (Z_o + j Z_{LOAD} \tan L)$$

where L is the electrical path length. By choosing the small interconnecting transmission lines between ports to be approximately 50 ohms and with a design of 20 dB test port return loss, the maximum desired electrical path length in any one of the three arms is found to be 0.10 of the wavelength at the highest frequency. For the geometry described above, this corresponds to 0.045 inches at 26.5 GHz.

Figure 9A:
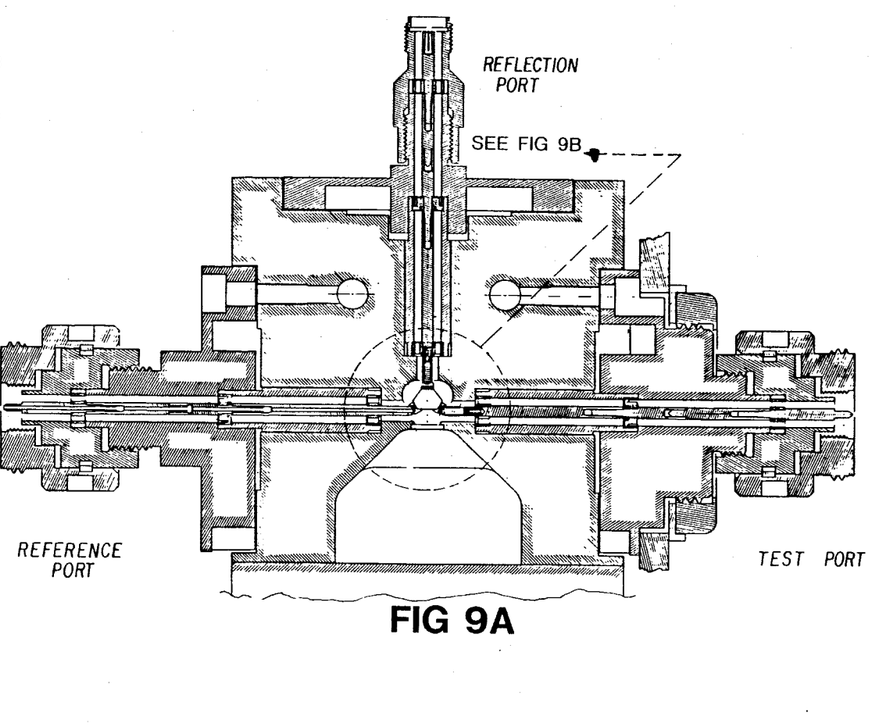
FIGS. 9A and 9B are cross-sectional view of the bridge housing.
Figure 9B:
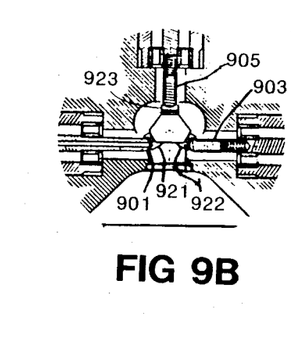

Another unique feature of microcircuit 6 is that it is mechanically supported totally by its electrical connections. As illustrated in FIG. 9, which is a cross-section of housing 1, outer coax 901, supports the microcircuit at the reference port. The end most tip of outer coax 901 is typically hemispherical in shape with a hole therethrough to accommodate inner coax 825, and contacts the drilled end 921 of arrowhead 821. The test port of the microcircuit is supported by a spring loaded ball joint 903 which contacts the drilled end 922 of arrowhead 822. The reflection port is supported by a spring loaded piece of slabline 905 which rests in a slot 923 cut in the end of arrowhead 823. This manner of three element mechanical support permits very stable mounting which also permits electrical adjustment within the housing by placing tuning screws (not shown) through bottom ground plane 910 of housing 1 directly under the joint between each arrowhead and its electrical/mechanical connection.

TABLE

| MATERIAL | PROPERTY* | ELECTROMAGNETIC CHARACTERISTICS | | | | | | | | | | | |
|---|---|---|---|---|---|---|---|---|---|---|---|---|---|
| | | $10^2$ | $10^3$ | $10^4$ | $10^5$ | $10^6$ | $10^7$ | $10^8$ | $10^9$ | $3 \times 10^9$ | $8.6 \times 10^9$ | $10^{10}$ | $1.8 \times 10^{10}$ |
| MF-112 | K' | 20 | 18 | 16 | 14 | 12 | 10 | 8 | 6 | 5.2 | 5.0 | 4.8 | 4.6 |
| | TAN D | 0.02 | 0.02 | 0.03 | 0.03 | 0.03 | 0.04 | 0.04 | 0.04 | 0.05 | 0.05 | 0.04 | 0.03 |
| | K" | 0.04 | 0.36 | 0.48 | 0.42 | 0.36 | 0.40 | 0.32 | 0.24 | 0.26 | 0.25 | 0.19 | 0.14 |
| | M' | 2.0 | 1.9 | 1.8 | 1.7 | 1.6 | 1.5 | 1.5 | 1.4 | 1.4 | 1.1 | 1.1 | 1.0 |
| | TAN M | 0 | 0 | 0 | 0 | 0 | 0 | 0.01 | 0.02 | 0.03 | 0.22 | 0.23 | 0.26 |
| | M" | 0 | 0 | 0 | 0 | 0 | 0 | 0.02 | 0.03 | 0.04 | 0.24 | 0.25 | 0.26 |
| | dB/IN | 0 | 0 | 0 | 0 | 0 | 0 | 0.05 | 0.41 | 1.5 | 12.4 | 14.2 | 25.7 |
| | $|Z|/Z_o$ | 0.32 | 0.32 | 0.34 | 0.35 | 0.37 | 0.39 | 0.43 | 0.48 | 0.52 | 0.47 | 0.48 | 0.47 |
| MF-124 | K' | 260 | 205 | 145 | 95 | 70 | 52 | 40 | 32 | 25.8 | 23.8 | 23.6 | 23.0 |
| | TAN D | 0.04 | 0.39 | 0.36 | 0.31 | 0.26 | 0.20 | 0.14 | 0.08 | 0.07 | 0.05 | 0.03 | 0.04 |
| | K" | 104 | 80 | 52 | 29 | 18 | 10 | 5.6 | 2.6 | 1.8 | 1.19 | 0.71 | 0.92 |
| | M' | 7.0 | 6.9 | 6.8 | 6.7 | 6.6 | 6.3 | 6.0 | 5.0 | 3.8 | 2.50 | 1.5 | 1.0 |
| | TAN M | 0 | 0 | 0 | 0 | 0 | 0 | 0.2 | 0.45 | 0.69 | 1.10 | 1.4 | 2.5 |
| | M" | 0 | 0 | 0 | 0 | 0 | 0 | 1.2 | 2.3 | 2.62 | 2.75 | 2.1 | 2.5 |
| | dB/IN | 0 | 0 | 0 | 0 | 0 | 0.08 | 1.2 | 17 | 50 | 160 | 170 | 378 |

TABLE-continued

| MATERIAL | PROPERTY* | ELECTROMAGNETIC CHARACTERISTICS | | | | | | | | | | | |
|---|---|---|---|---|---|---|---|---|---|---|---|---|---|
| | | $10^2$ | $10^3$ | $10^4$ | $10^5$ | $10^6$ | $10^7$ | $10^8$ | $10^9$ | $3 \times 10^9$ | $8.6 \times 10^9$ | $10^{10}$ | $1.8 \times 10^{10}$ |
| | $|Z|/Z_o$ | 0.16 | 0.18 | 0.21 | 0.26 | 0.30 | 0.34 | 0.39 | 0.42 | 0.42 | 0.39 | 0.33 | 0.34 |

*Where the complex dielectric constant is given by (K' - jK" TAN D), the complex magnetic permeability by (M' - jM" TAN M).

TABLE II
LOAD ELEMENT DIAMETERS

| ELEMENT NUMBER | O.D. (inches) | I.D. (inches) |
|---|---|---|
| 710 | 0.1698 | 0.1503 |
| 711 | 0.1497 & 0.0797 | 0.0480 |
| 712 | 0.1698 | 0.0797 & 0.01497 |
| 713 | 0.0800 | 0.0504 |
| 714 | 0.1698 | 0.0800 |
| 715 | 0.0750 | 0.0504 |
| 716 | 0.1698 | 0.0750 |
| 717 | 0.0700 | 0.0512 |
| 718 | 0.1698 | 0.0700 |
| 719 | 0.1698 | 0.0547 |
| 720 | 0.1698 | 0.0478 |
| 721 | 0.1500 | 0.0508 |
| 722 | 0.1698 | 0.1500 |
| 723 | 0.1400 | 0.0504 |
| 724 | 0.1698 | 0.1400 |
| 725 | 0.1300 | 0.0496 |
| 726 | 0.1698 | 0.1300 |
| 727 | 0.1200 | 0.0488 |
| 728 | 0.1698 | 0.1200 |
| 729 | 0.1100 | 0.0484 |
| 730 | 0.1698 | 0.1100 |
| 731 | 0.1000 | 0.0484 |
| 732 | 0.1698 | 0.1000 |
| 733 | 0.0900 | 0.0484 |
| 734 | 0.1698 | 0.0900 |
| 735 | 0.0800 | 0.0484 |
| 736 | 0.1698 | 0.0800 |
| 737 | 0.0700 | 0.0480 |
| 738 | 0.1698 | 0.0700 |
| 739 | 0.1698 | 0.0500 |
| 740 | 0.1698 | 0.0492 |

TABLE III
DIMENSIONS ON FIG. 8B

| ELEMENT | DIMENSION (inches) |
|---|---|
| W | 0.0063 |
| X | 0.010 |
| Y | 0.003 |
| Z | 0.002 |
| L1 | 0.030 |
| L2 | 0.025 |
| L3 | 0.019 |
| L4 | 0.027 |
| L5 | 0.035 |
| L6 | 0.008 |
| L7 | 0.023 |
| L8 | 0.020 |
| D1 | 0.0894 |
| D2 | 0.1189 |
| R | 0.535 |

What is claimed is:

1. A wide bandwidth R. F. vector bridge configured in a terminated wheatstone arrangement comprising:
a housing having a test port connector means for connecting said bridge to a device under test, having a reference port connector means for connecting said bridge to a load, and having a reflection port connector means for connecting said bridge to electrical devices external to said housing;
a microcircuit located within said housing, said microcircuit further comprising:
a substrate having two parallel faces;
a patterned layer of conductive material on each face of said substrate defining primarily three areas on each face, one a reflection port area, one a reference port area, and one a test port area;
a first pair of capacitors, one on each face of said substrate between said test port area on that face and said reflection port area on that face;
a second pair of capacitors, one on each face of said substrate located between said reference port area on that face and said reflection port area on that face;
eight resistors, with four of said eight resistors located on each face of said substrate, with a first pair of said resistors on each face coupled in series with one of said first pair of capacitors on that face with said one of said first pair of capacitors being connected in series between said first pair of resistors, said series connection of said first pair of resistors and said one of said first pair of capacitors forming a connection between said test port area and said reference port area on that face, and with a second pair of said resistors coupled in series with one of said second pair of capacitors on that face with said one of said second pair of capacitors being located between said second pair of resistors, said series connection of said second pair of resistors and said one of said second pair of capacitors forming a connection between said reference port area and said reflection port area on that face;
first coupling means attached to each of said reflection port areas to form a reflection port, said first coupling means for coupling said reflection port to said reflection port connector means;
second coupling means attached to each of said reference port areas to form a reference port, said second coupling means for coupling said reference port to said reference port connector means;
third coupling means attached to each of said test port areas to form a test port, said third coupling means for coupling said test port to said test port conenctor means; and
said resistors, capacitors, and said first, second, and third coupling means arranged symmetrically about said reflection port to provide equal signal transit times between said reflection port and said reference port and between said reflection port and said test port.

2. A device as in claim 1 wherein said substrate comprises sapphire in the shape of an irregular hexagon.

3. A device as in claim 1 wherein the combined resistance between any two ports is substantially 50 ohms.

4. A device as in claim 1 wherein said reference port connector means comprises a spring-loaded ball joint and wherein said second coupling means is adapted to receive in an abutting arrangement said spring-loaded ball joint which serves as both an electrical connection and a mechanical support without the use of other independent connecting devices between said ball joint and said second coupling means.

5. A device as in claim 1 wherein said reflection port connector means comprises a spring-loaded piece of slab-line, and wherein said first coupling means is adapted to receive in an abutting arrangement said spring-loaded piece of slab-line which serves as both an electrical connection and a mechanical connection without the use of other independent connecting devices between said slab-line and said first coupling means.

6. In an RF vector bridge, a microcircuit to be used at a maximum RF frequency F, comprising:
   a substrate having two opposing faces;
   a patterned layer of conductive material on each face of said substrate defining a reflection port area, a reference port area, and a test port area;
   first impedance means for providing a first impedance between said reflection port area and said reference port area;
   second impedance means for providing a second impedance between said reflection port area and said test port area;
   reflection port means for coupling said reflection port area to other electrical components;
   reference port means for coupling said reference port area to a reference load; and
   test port means for coupling said test port area to a device under test;
   said first and second impedance means, said reflection port means, said reference port means, and said test port means arranged to provide equal times for signal transit between said reflection port means and said test port means and between said reflection port means and said reference port means, with a maximum electrical path length between any two of said port means of at most 0.1 wavelengths at the frequency F.

7. A mcirocircuit as in claim 6 wherein said reflection port area on each face of said substrate is symmetric with respect to said reference port area and said test port area.

8. a microcircuit as in claim 7 wherein said first impedance is equal to said second impedance.

9. A mcirocircuit as in claim 8 wherein said first impedance comprises two equal third impedances, with one of said third impedances attached to said microcircuit between said reflection port area and said reference port area on each face of said substrate.

10. A microcircuit as in claim 9 wherein said second impedance comprises two equal fourth impedances, with one of said fourth impedances attached to said microcircuit between said reflection port area and said test port area on each face of said substrate.

11. A microcircuit as in claim 8 wherein said reference port means comprises coaxial input means for coupling said microcircuit to a source of RF power and for creating a fifth impedance in said microcircuit.

12. A microcircuit as in claim 11 wherein said coaxial input means comprises biasing means for providing a bias potential to said test port means.

13. A microcircuit as in claim 12 wherein said test port means comprises balancing means for providing a sixth impedance to balance said fifth impedance caused by said coaxial input means, thereby preserving impedance balance between said reflection port means and said reference port means and between said reflection port means and said test port means.

14. An RF vector bridge to be used at a maximum frequency F comprising:
   a housing; and
   a microcircuit within said housing and attached thereto, comprising:
      a substrate having two opposing faces;
      a patterned layer of conductive material on each face of said substrate defining a reflection port area, a reference port area, and a test port area;
      first impedance means for providing a first impedance between said reflection port area and said reference port area;
      second impedance means for providing a second impedance between said reflection port area and said test port area;
      reflection port means for coupling said reflection port area to other electrical components;
      reference port means for coupling said reference port area to a reference load; and
      test port means for coupling said test port area to a device under test;
      said first and second impedance means, said reflection port means, said reference port means, and said test port measn arranged to provide equal times for signal transit between said reflection port means and said test port means and between said reflection port means and said reference port means, with a maximum electrical path length between any two of said port means.

15. A bridge as in claim 14 wherein said housing comprises reflection port coupling means for attaching said housing to said reflection port means, reference port coupling means fSor attaching said housing to said reference port means, and test port coupling means for attaching said housing to said test port means.

16. A bridge as in claim 15 wherein said reflection port coupling means includes a spring-loaded piece of slabline and said reflection port means includes a slot adapted to receive said slabline.

17. A bridge as in claim 16 wherein said test port coupling means includes a spring-loaded ball joint and said test port means is adapted to receive said ball joint.

18. A microcircuit as in claim 17 wherein said reflection port coupling means, said test port coupling means, and said reference port coupling means serve as mechanical support elements for said microcircuit in said housing and also as electrical leads to said microcircuit from outside said housing.

19. An R. F. vector bridge as in claim 14 wherein between any two of said port means there is a maximum electrical path length of at most 0.1 wavelengths at the frequency F.

20. A wide bandwidth R.F. vector bridge as in claim 1 wherein between any two ports selected from said reference port, said reflection port, and said test port, there is a maximum electrical path length of at most 0.1 wavelengths at the maximum frequency of operation of the bridge.

* * * * *

UNITED STATES PATENT AND TRADEMARK OFFICE
CERTIFICATE OF CORRECTION

PATENT NO. : 4,720,677
DATED : January 19, 1988
INVENTOR(S) : S. Bruce Donecker and Julius K. Botka It is certified that error appears in the above-identified patent and that said Letters Patent is hereby corrected as shown below:

Column 2, Line 44, & 45 "the wavelength" should read --wavelengths--;

Column 4, Line 40, "As shown in Figure $7_A$" should read --As shown in Figure $7_H$--;

Column 4, Line 11, "port I" should read --port I, the reflection port--;

Column 4, Lines 60--65, in bold type should not be in bold type;

Column 5, Line 2, "lossless" should be --low loss--;

Column 12, Line 28, "measn" should read --means--;

Column 10, Line 49, "conenctor" should read --connector--;

Column 12, Line 37, "coupling means fSor" should read --coupling means for--.

Signed and Sealed this

Twenty-fourth Day of January, 1989

*Attest:*

DONALD J. QUIGG

*Attesting Officer*  *Commissioner of Patents and Trademarks*